(12) United States Patent
Koehler et al.

(10) Patent No.: US 11,105,857 B2
(45) Date of Patent: Aug. 31, 2021

(54) PREDICTION OF END-OF-LIFE OF A DIRECT CURRENT (DC) MOTOR

(71) Applicant: Hewlett-Packard Development Company, L.P., Spring, TX (US)

(72) Inventors: Duane A Koehler, Vancouver, WA (US); Michael Ewe, Vancouver, WA (US); Eric Collins, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 95 days.

(21) Appl. No.: 16/500,523

(22) PCT Filed: Apr. 14, 2017

(86) PCT No.: PCT/US2017/027813
§ 371 (c)(1),
(2) Date: Oct. 3, 2019

(87) PCT Pub. No.: WO2018/190879
PCT Pub. Date: Oct. 18, 2018

(65) Prior Publication Data
US 2021/0116508 A1     Apr. 22, 2021

(51) Int. Cl.
*G01R 31/34* (2020.01)
(52) U.S. Cl.
CPC .................. *G01R 31/343* (2013.01)
(58) Field of Classification Search
CPC ...... G01R 31/34; G01R 31/343; H02K 11/20; H02K 15/00
See application file for complete search history.

(56) References Cited

U.S. PATENT DOCUMENTS 6,262,550 B1   7/2001  Kliman et al.
8,699,896 B2   4/2014  Ishigaya et al.
(Continued)

FOREIGN PATENT DOCUMENTS

DE    102016004774    *  2/2020  ............ G01R 31/00
EP    2527942 A2        11/2012
(Continued)

OTHER PUBLICATIONS

José Carlos Gamazo-Real, Position and Speed Control of Brushless DC Motors Using Sensorless Techniques and Application Trends, 47 pages, Sensors 2010 (Year: 2010).*

(Continued)

Primary Examiner — Tung S Lau
(74) Attorney, Agent, or Firm — HP Inc. Patent Department

(57) ABSTRACT

Described herein are techniques that facilitate the prediction of the end-of-life of a direct current (DC) motor of an apparatus. The described techniques include tracking end-of-life indicative motor-response values of a DC motor based on an applied-voltage value at its corresponding specified speed of the DC motor when the motor is engaged, in response to the determination that the tracked values exceed a range of acceptable operational values, a health-status notification regarding that DC motor is generated. This Abstract is submitted with the understanding that it will not be used to interpret or limit the scope or meaning of the claims.

13 Claims, 3 Drawing Sheets

(56) References Cited

U.S. PATENT DOCUMENTS

| | | |
|---|---|---|
| 2009/0096406 A1 | 4/2009 | Flickinger et al. |
| 2009/0276165 A1 | 11/2009 | Weiss et al. |
| 2009/0281734 A1 | 11/2009 | Abbatat |
| 2013/0179104 A1 | 7/2013 | Howell et al. |

FOREIGN PATENT DOCUMENTS

| | | | | | |
|---|---|---|---|---|---|
| JP | 2003-263079 A | * | 9/2003 | ............. | G03G 15/02 |
| JP | 4872627 | * | 2/2012 | ............. | G01M 15/02 |
| JP | 2016-208773 | * | 12/2016 | ............. | H02P 27/06 |
| JP | 2017-46540 | * | 3/2017 | ............. | H02P 29/00 |
| JP | .2017-046540 A | * | 3/2017 | ............. | H02P 29/00 |
| JP | 6262686 | * | 1/2018 | ............. | H01P 27/06 |
| WO | WO-2006/014997 A1 | | 2/2006 | | |
| WO | WO2015116161 A1 | * | 8/2015 | ............. | G01R 31/34 |
| WO | WO-2015116161 A1 | | 8/2015 | | |

OTHER PUBLICATIONS

Hyun-Sam Jung, Control of Three-Phase Inverter for AC Motor Drive With Small DC-Link Capacitor Fed by Single-Phase AC Source, IEEE Transactions on Industry Applications, vol. 50, No. 2, Mar./Apr. 2014, 8 pages (Year: 2014).*

Britt, et al., HP Inc. Unleashes Next Generation A3 Printing Portfolio to Disrupt $55B Copier Segment, Sep. 12, 2016, http://www8.hp.com/ ~ 3 pages.

\* cited by examiner

PREDICTION OF END-OF-LIFE OF A DIRECT CURRENT (DC) MOTOR

BACKGROUND

Printers and multifunction peripherals (MFPs) rely on motion control systems to move media (e.g., paper) from an input tray, through the marking engine, and then to an output bin or finisher. The motion control sub-systems of these devices have direct current (DC) motors to handle the media movement. Users have grown to expect the DC motors of these devices to run faster, quieter, and more reliably over a long service life. This is true even for large enterprise installations.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Figure 1:
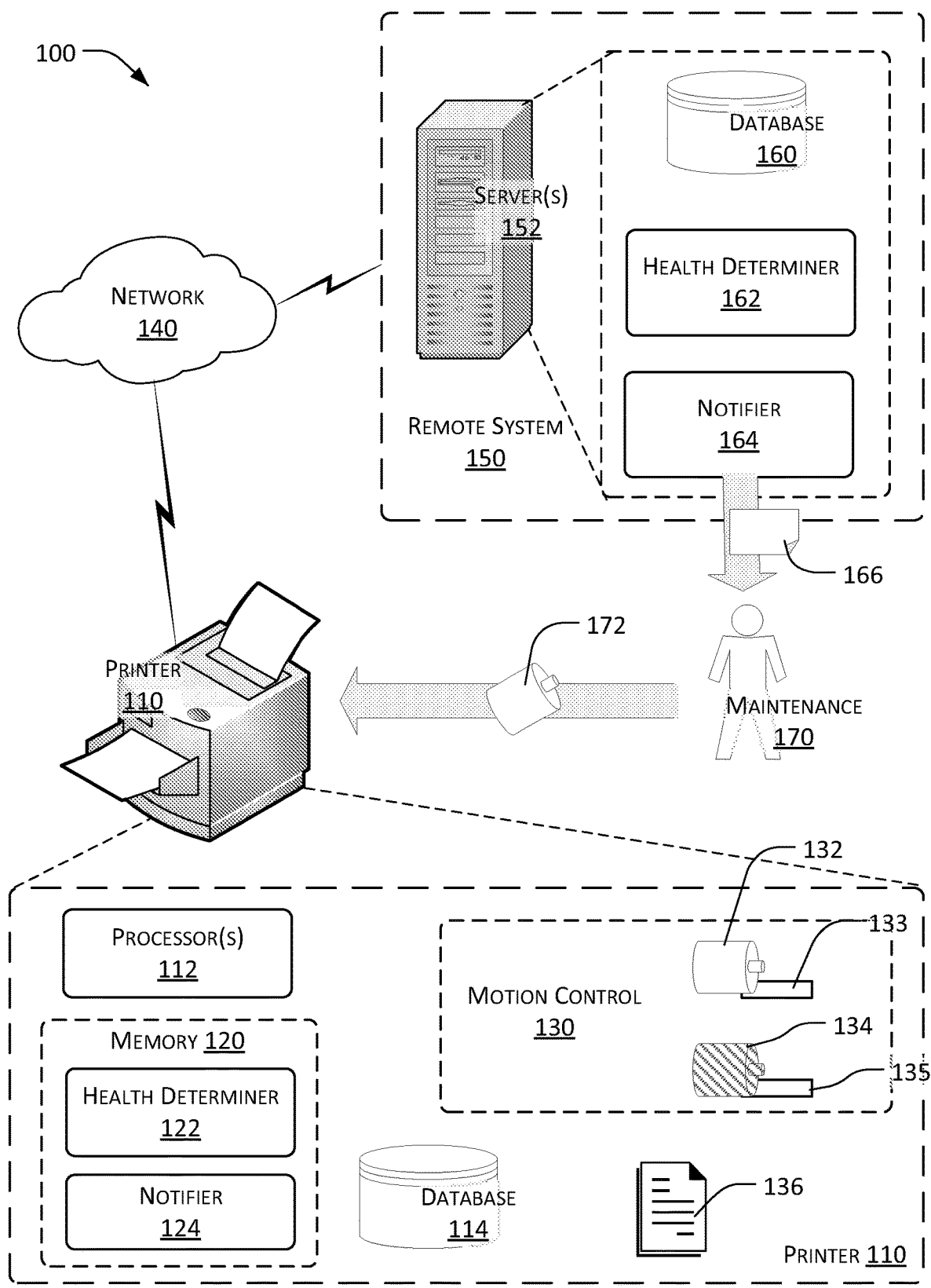
FIG. 1 illustrates an example of a system incorporating an implementation of an apparatus in accordance with implementations described herein.

Described herein are technologies to facilitate the prediction of end-of-life of direct current (DC) motors of the motion control sub-systems of an apparatus. Examples of such an apparatus is a printer, copier, scanner, multifunction peripheral, or printing system. Other examples include additive manufacturing devices, such as 3D printing systems.

A typical home desktop printer might have only 2-3 DC motors and print less than a hundred pages per month. In contrast, the latest large enterprise printing systems may have fifty or more DC motors and print thousands of pages per month at up to 80 pages per minute (PPM). Customers expect these printing systems to last for many years of heavy usage.

DC motors, of course, move. By their nature, moving parts wear out eventually. Because of their limited duty cycles, the DC motors in a small home printer might never fail in the lifetime of the printer. However, because of their heavy duty cycles and a large number of DC motors, large printing systems will experience motor failure. Because of the commercial environment, unexpected down time of a printing system can be costly.

More generally, the described technology helps estimate the relative health of the DC motors of the apparatus based on the motor-response values of the DC motors that are indicative the end-of-life of a typical DC motor based on the voltage applied to the DC motors and its corresponding speed. In response to that estimation, the described technology may generate a notification regarding the status of the relative health of the motors. Based on such notification, a maintenance visit may pre-emptively replace DC motors that are nearing their end of life.

Without this approach, a motor failure may lead to unexpected and costly down time for the apparatus. Of course, other approaches are employed to address this but they introduce additional and now unnecessary costs. Examples of conventional approaches include periodic replacement, more expensive equipment, and/or additional monitoring hardware.

Based on the minimum life expectancy, a conventional periodic replacement approach replaces all motors on a scheduled maintenance basis. This conventional approach produces many unnecessary motor replacements. Since most of the motors will never fail during the life of the apparatus, this conventional approach is expensive. Not only the cost of the motors, but the labor cost would be high. Indeed, this conventional approach may produce more problems than it solves because the risk of damage due to service is higher than the risk of motor failure.

Another conventional approach uses higher quality equipment and, thus, more expensive equipment. In particular, higher quality DC motors may be used. Of course, by its nature, this produces a more expensive apparatus, but without adding any more features or overall value.

Still another conventional approach uses expensive additional hardware for monitoring. In short, additional sensors on each motor adds cost to each motor. Unlike the conventional approaches, an implementation of the technology described herein use the sensor on each motor that is already there for other purposes.

FIG. 1 shows an example of a system 100 incorporating an implementation of an apparatus that facilitate the prediction of end-of-life of direct current (DC) motors of the motion control sub-systems of an apparatus. As depicted, the example system 100 includes a printer 110, remote system 150, and a communications network 140 therebetween.

Together or alone, the printer 110 and the remote system 150 represent an implementation of the technology described herein. The printer 110 represents the apparatus with the DC motors therein. Of course, the apparatus of other implementations may be a different device that uses DC motors.

As depicted, the printer 110 includes at least one processor 112, a database 114, a memory 120, and a motion control sub-system 130. The memory 114 stores sets of processor-executable instructions, such as a health determiner 122 and notifier 124. Alternatively, these functional components may be implemented as firmware or hardware only. Although depicted separately, the database 114 may be part of the memory 120.

The motion control sub-system 130 includes a healthy DC motor 132 and an unhealthy DC motor 134. Typically, a DC motor is driven by a motion system that implements closed-loop servo control. For a given move for a given actuator, a particular force is applied to accelerate and then maintain the actuation through its full range of motion.

Each motor has its associated sensor: sensor 133 and sensor 135. These sensors measure the speed of its engaged motor. These sensors are used in the normal operation of the printer and are not provided specifically for end-of-life predictive purposes. However, other implementations may employ sensors specifically designed to measure the desired motor-response values.

These two motors 132 and 134 are merely representative motors in the printer 110. With other implementations, a printer may have DC motors. Indeed, a printer may have many scores of motors. Hundreds of motors in a printer is a possibility.

With the DC motors 132 and 134, motion control sub-system 130 moves paper from a source 136, like an input tray. Typically, the system 130 pulls the paper through a marking engine (not shown) and sends the finished page to an output tray (not shown).

When the printer 110 is in operation, the motion control sub-system 130 directs the DC motors to move in order to move paper from the input tray 136 and through the printer. More particularly, the motion control sub-system 130 applies a voltage to a DC motor, like motor 132, to engage the DC motor.

Typically, a sufficient voltage is applied to the motor 132 so that it turns at a specified or desired rotation. This rotation may also be called speed or velocity herein. This speed is measured by a speed sensor, such as the sensor 133, of the DC motor. Over the life of the motor, the amount of voltage needed for the DC motor 132 to attain its desired speed increases.

The health determiner 122 obtains a value of a voltage applied to the DC motor 132 to engage the DC motor and a value of the speed of the DC motor when that motor is engaged. In this example, the sensor 133 measures the speed of the DC motor to obtain the value of that speed.

To facilitate the prediction of the end-of-life of the DC motor 134, the health determiner 122 calculates end-of-life indicative motor-response values based on the applied voltage value at its corresponding specified speed value. A motor-response value is a value of a property that is measured, modeled, and/or calculated in response to a voltage applied to that motor over time up to that moment. This is part of our thermal model which is part of the normalizing the "motor response." In an implementation, the motor-response value is a function of motor component (e.g., motor windings and magnets) temperature.

The accuracy of this motor component temperature model can be improved with the addition of thermocouple or thermistor measurements of motor case temperature and/or ambient temperature.

Typically, the motion control sub-system 130 includes servo firmware. The motion control sub-system 130 commands the DC motor 132 to attain a designated speed. In response to that command, the sub-system 130 of the DC motor 132 increases the applied voltage to achieve the commanded speed using a closed loop feedback control algorithm. Typically, if the voltage required is higher than expected given the motor's modeled component temperatures, that means the motor's response to applied voltage indicates the motor is not operating as expected. A typical-motor chart, which is discussed below, is a model of expectation in this instance.

The health determiner 122 calculates particular motor-response values that have a correlation with the health or end-of-life of a DC motor. Examples of such end-of-life indicative motor-response values include the temperature of the DC motor, the torque of the DC motor, a pattern of velocity irregularities of the DC motor, and a combination thereof.

The temperature and torque may be modeled. The modeled temperature integrates the applied voltage over time and reveals if the motor is running with higher applied voltage than expected when it might otherwise be difficult to determine.

The health determiner 122 stores the calculated motor-response values in the database 114. Thus, it tracks the motor-response values of the operation of the DC motor over time. The printer 110 may periodically upload the collected values to the remote system 150. Alternatively, instead of having its own database 114, the printer 110 may send each calculated motor-response values to the remote system 150.

Based on the tracked end-of-life indicative motor-response values, the health determiner 122 determines whether the DC motor 134 is approaching its end of life based on the life of a typical DC motor under the same or similar conditions. More particularly, the end-of-life indicative motor-response values of a typical DC motor is charted over the life of that typical DC motor.

This typical-motor chart is based on a lifetime of indicative motor-response values collected from a multitude of motors in operation. This is discussed in more detail below with regard to FIG. 2.

When it appears that the end-of-life of the DC motor 134 is approaching, the notifier 124 generates a notification that preventative maintenance should be performed on that DC motor. Depending on the circumstances, the order to replace the DC motor 134 may be automatically added to the next scheduled maintenance visit. Thus, when maintenance personnel 170 visits printer 110 next, they will replace motor 134 with new motor 172.

A network 150 connects the printer 110 together with the remote system 150. The network 150 may be a wired, wireless, or some combination thereof. The network 150 may include the Internet infrastructure, and it may be presented as the so-called "cloud." The network 150 may include wired or wireless local area network, a cellular network, and/or the like.

The remote system 150 includes servers 152. Indeed, the remote system 150 may be a central location or several distributed locations. It can be represented by the so-called "cloud." Regardless, the servers 152 have memories that hold and processors that execute functional components that include a database 160, a health determiner 162, and a notifier 164.

Each of the printer 110 and the remote system 150 has commonly named functional components. Those are the health determiner 122 and 162, notifier 124 and 164, and the database 114 and 160. Depending on the particulars of the implementation, these functional components work cooperatively or separately to accomplish some or all of the features of the technology described herein.

For example, in some implementations, the health determiner 162 of the remote system 150 may perform all of the above-described functions of the health determiner 122 of the printer 110. Similarly, the database 160 of the remote system 150 pay perform all of the above-described functions of the database 114 of the printer 110.

In addition, the notifier 164 of the remote system 150 may perform all of the above-described functions of the notifier 124 of the printer 110. Indeed, as depicted, the notifier 164 may send a notification 166 to the maintenance personnel 170 to perform the motor replacement. Examples of such notifications include a text message, an email, a calendar/schedule entry, a database indication, a work order, and the like.

Figure 2:
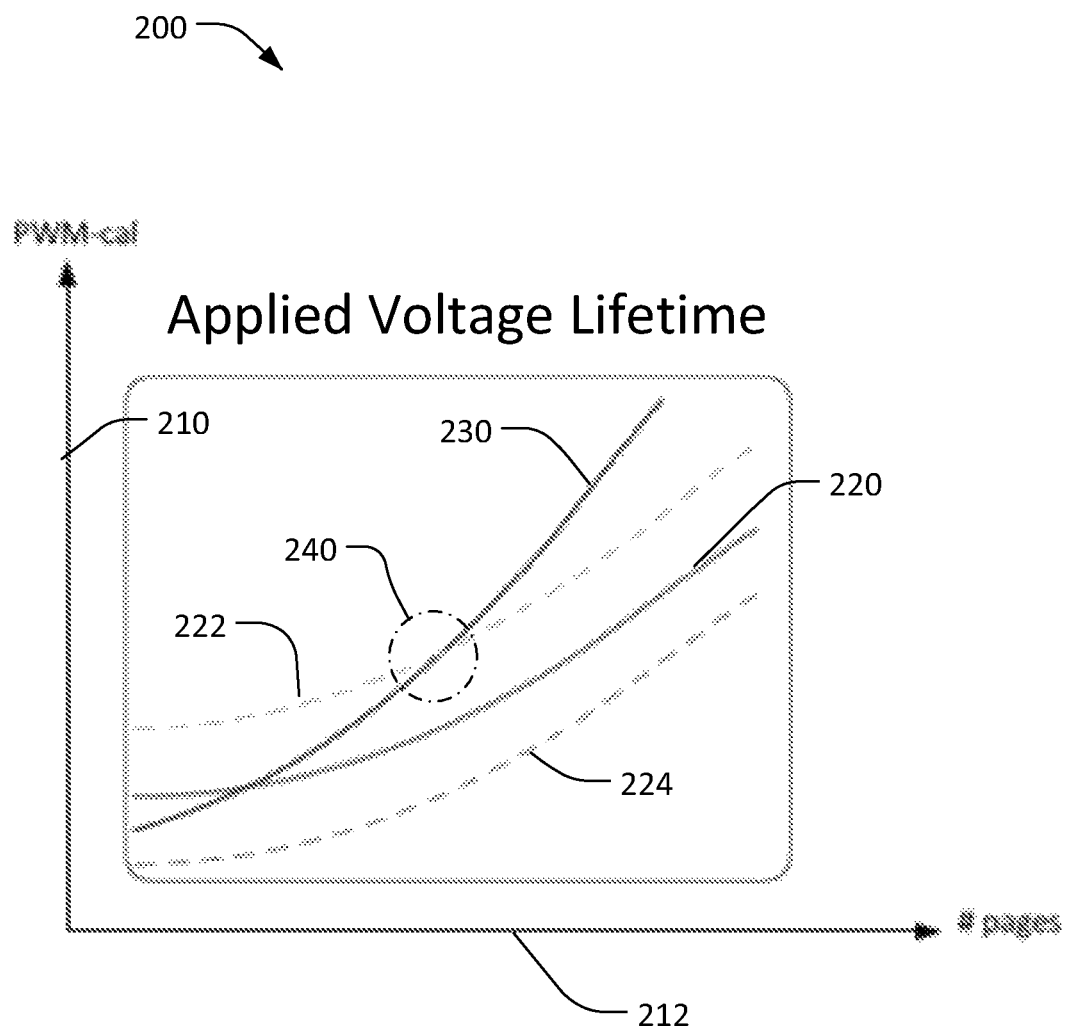
FIG. 2 illustrates an example lifetime chart of a DC motor based on a particular health indicative motor-response value in accordance with implementations described herein.

FIG. 2 shows an example lifetime chart 200 of a particular health indicative motor-response value of a DC motor doing a particular actuation. That particular value is applied voltage, which is also called pulse width modulation (PWM). This chart 200 shows a calibrated or normalized PWM; thus, the y-axis 210 is labeled PWM-cal. The x-axis 212 of the chart 200 represents time as measured in number of pages.

As depicted, typical-motor line 220 represents the applied voltage over the lifetime of a typical DC motor. That is, a typical DC motor that is of same or similar type, brand, conditions, and/or environment. The typical-motor line 220 is generated based a collection of applied voltage measurements taken over the lifetime of many motors. Depending on the implementation, the typical-motor line 220 may be the mean, median, or some other statistical calculation of the collection of measurements.

In some implementations, the typical-motor line 220 may be initially based on data derived from laboratory or simulated environments. However, in those implementations, the typical-motor line 220 may be interactively improved and adjusted based on actual tracked motor-response values uploaded to the remote system 150 from a host of installed operating printers.

In the example lifetime chart 200, equally spaced dashed lines appear above and below the typical-motor line 220. As depicted, upper dashed line 222 is three standard deviations (i.e., +3σ) above the typical-motor line 220 and lower dashed line 224 is three standard deviations (i.e., −3σ) above the typical-motor line. The range between the upper dashed line 122 and lower dashed line 124 represents the range of defined acceptable operational values. Of course, other implementations may use other mechanisms to determine an appropriate range of defined acceptable operational values. In some cases, only the upper range may be of interest, since it indicates motor wear-out. Or, the lower limit may be set with a higher number of standard deviations from the expected typical value.

The health determiner 162 of the remote system 150 may generate and/or improve the typical-motor line 220 based on actual tracked motor-response values uploaded to the remote system from host of installed operating printers. In so doing, the health determiner 162 effectively adjusts the appropriate range of defined acceptable operational values for the typical DC motor. The remote system 150 may download this updated range to the printers implementing the technology described herein.

As depicted, profile line 230 represents the tracked applied voltages over the lifetime of a particular DC motor of a particular apparatus. In area 240, the profile line 230 crosses the upper dashed line 222. When the health determiner 122 and/or 162 determines that this has occurred, then it determines that the motor associated with that profile line 230 is approaching its end of life.

The example lifetime chart 200 of is based on the tracked applied voltage of a DC motor. Alternatively or in addition, other health indicative motor-response values may be used in implementations of the technology described herein.

For example, the temperature of the DC motor may be employed as a health indicative motor-response value for implementations of the technology described herein. In some implementations, the temperature may be directly measured by a temperature sensor. In other implementations, the temperature may be derived or modeled by integrating the applied-voltage value at its corresponding speed value over time. That is, a temperature may be modeled for a DC motor based on a thermal model of heat transfer of a given motor, by integrating the modeled energy into the system from the applied voltage and speed, minus the modeled energy out of the system via heat transfer, over time.

The torque of the DC motor is another example health indicative motor-response value that may be used by implementations of the technology described herein. The torque of the motor is calculated based on the applied-voltage value at its corresponding measured speed. That speed may be compensated for by its modeled temperature.

Each motor used in the printer is characterized a priori, and a model is developed to estimate torque by using the internal parameters of the motor. The internal parameters of interest may include the following: motor windings resistance, motor torque constant, motor back electromagnetic frequency (EMF) constant, motor inductance and motor thermal characteristics (thermal resistance and capacitances). Using the model, the torque can be calculated during the operation of the printer using the applied voltage and measured speed. By calculating the average torque needed when running the motor at a constant speed, the calculated values can be compared to a known torque value of a motor operating within specifications.

A pattern of velocity irregularities of the DC motor in response to the applied voltage is another example health indicative motor-response value that may be used by implementations of the technology described herein. Herein, this may also be called patterns of erratic velocities or jerkiness of movement. As a motor ages, it may move less and less smoothly. Indeed, it may violently jerk during its rotation in response to applied voltage. These occurrences are noted and measured. During normal operation, the motor velocity is expected to be smooth and well controlled. Irregular behavior can be detected by measuring the severity of any velocity ripple that might be present. By measuring the amplitude and frequency of the velocity ripples, an assessment of the health of the motor and overall system can be made.

Figure 3:
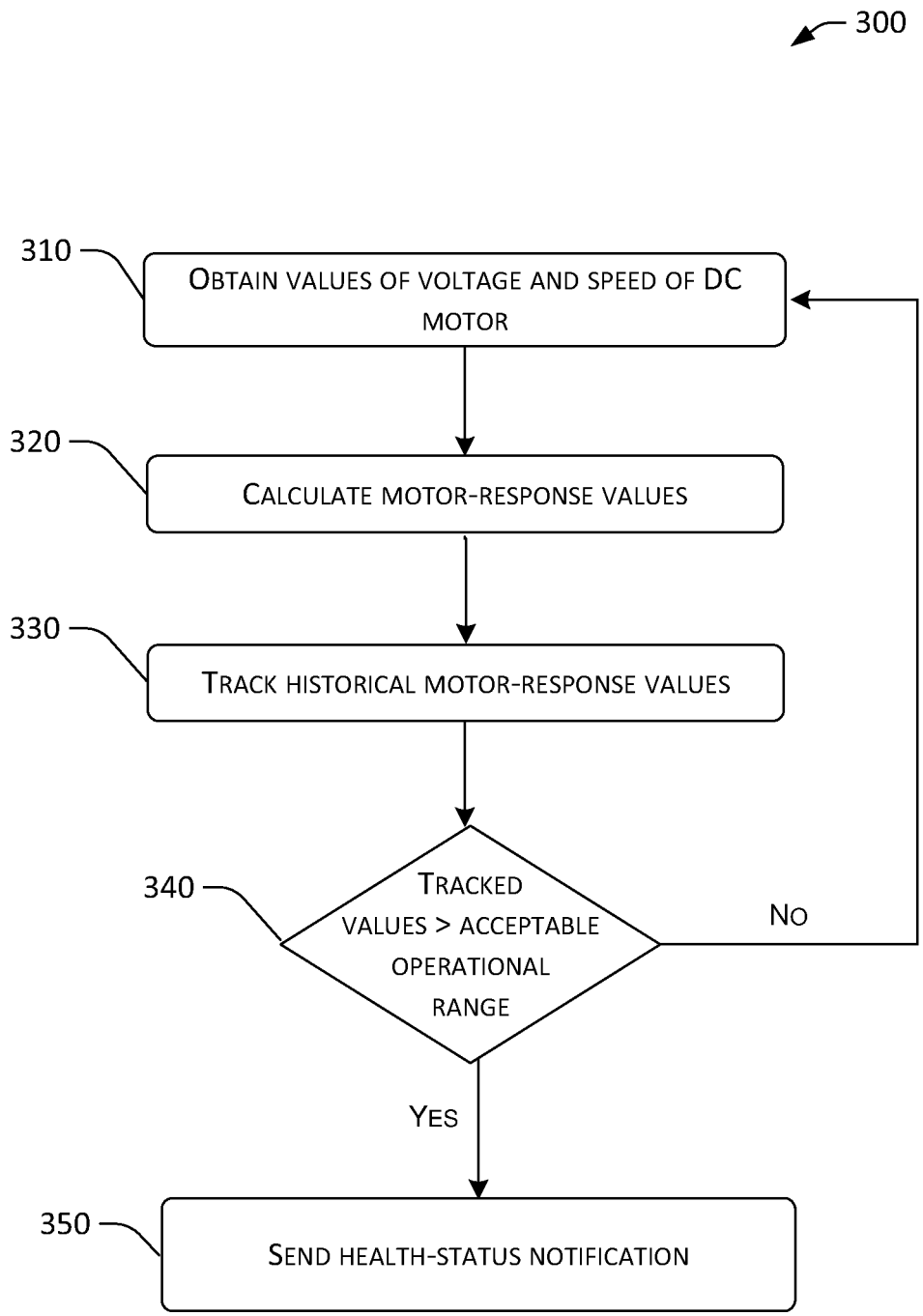
FIG. 3 shows a flow diagram illustrating an example process in accordance with implementations described herein.

FIG. 3 is a flow diagram illustrating an example process 300 that implements the techniques described herein for facilitating the prediction of end-of-life of direct current (DC) motors of the motion control sub-systems of an apparatus. The example process 300 may be performed by, for example, the printer 110, the remote system 150, or some combination thereof. For the illustration purposes, the example process 300 is described as being performed by an example system.

At 310, the example system directs a DC motor of an apparatus to turn at a speed of a specified value and obtains a value of a voltage applied to the DC motor when it is engaged at that specified speed.

At 320, the example system calculates the end-of-life indicative motor-response values based on the applied-voltage value with its corresponding speed. The example system calculates the motor-response values of the DC motor that are indicative of the end-of-life of a typical DC motor based on the voltage applied to the DC motor and its corresponding speed.

Examples of the end-of-life indicative motor-response values include speed, applied voltage, the temperature of the DC motor, the torque of the DC motor, a pattern of velocity irregularities of the DC motor, or some combination thereof. Instead of being directly measured, the temperature may be modeled based on the known applied voltage and its corresponding speed. Likewise, rather than being directly measured, the torque can be determined based on the applied voltage and the corresponding speed. Some patterns of velocity irregularities are indicators of a motor wearing down.

The example system uses two measurements (e.g., applied voltage and encoded position) to facilitate failure prediction of the motor. The thermal model continually integrates the energy into and out of the motor. This temperature model normalizes the motor's velocity response to applied voltage. With this temperature model, the changes in response from motor temperature are coupled to the changes in response from impending motor failure. This temperature model is integrated over time, as energy is added from the applied voltage and dissipated from heat transfer to the environment.

To facilitate the prediction of the end-of-life of a particular DC motor of an apparatus, the example system tracks the measured or modeled values of the operation of the DC motor over time. In particular, the motor's response to applied voltage is characterized over the motor's lifetime.

At 330, the example system tracks historical motor-response values of the DC motor. For example, this may be accomplished by storing the tracked values in the database 114 of the printer 110 and/or in the database 160 of the remote system 150. These historical values for the DC motor in this database are collected over the life of the apparatus.

In some implementations, the example system may generate a model of the range of acceptable operational values. It does this by collecting historical indicative motor-response values from multiple apparatuses with DC motors and, based on the collected values, modeling the range of acceptable operational values for the end-of-life indicative motor-response values.

At 340, based on the tracked historical motor-response values, the example system determines whether the tracked values exceed a range of defined acceptable operational values. This range of defined acceptable operational values may be determined from an assemblage of tracked values from a multitude of installed and operational apparatuses with the same or similar DC motors.

If not, then the example process 300 returns to the beginning at block 310 and checks again later.

At 350, if it is determined that that the tracked values exceed the range of defined acceptable operational values, then the example system sends a health-status notification for that DC motor. That notification may indicate that the DC motor is approaching its end of life. Alternatively or additionally, the example system updates a schedule, generates a work order, sends an email, sends a text message, or the like.

This notification may indicate that preventative maintenance (e.g., motor replacement) needs to be performed. Indeed, a contracted maintenance worker/service may be notified, and a motor replacement may be included in the next routine maintenance that is scheduled for the apparatus.

In the above description of exemplary implementations, for purposes of explanation, specific numbers, materials configurations, and other details are set forth in order to better explain the present invention, as claimed. However, it will be apparent to one skilled in the art that the claimed invention may be practiced using different details than the exemplary ones described herein. In other instances, well-known features are omitted or simplified to clarify the description of the exemplary implementations.

The inventors intend the described exemplary implementations to be primarily examples. The inventors do not intend these exemplary implementations to limit the scope of the appended claims. Rather, the inventors have contemplated that the claimed invention might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques" or "technologies," for instance, may refer to at least one device, apparatus, system, method, article of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

These processes are illustrated as a collection of blocks in a logical flow graph, which represents a sequence of operations that can be implemented in mechanics alone or a combination with hardware, software, and/or firmware. In the context of software/firmware, the blocks represent instructions stored on computer-readable storage media that, when executed by at one processor, perform the recited operations.

Note that the order in which the processes are described is not intended to be construed as a limitation, and any number of the described process blocks can be combined in any order to implement the processes or an alternate process. Additionally, individual blocks may be deleted from the processes without departing from the spirit and scope of the subject matter described herein.

The term "computer-readable media" includes computer-storage media. For example, computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)).

What is claimed is:

1. A method that facilitates prediction of end-of-life of a direct current (DC) motor of a printing apparatus, the method comprising:

directing the DC motor of the printing apparatus to turn to move media for printing, including applying a certain voltage to the DC motor to engage the DC motor to turn;

in response to the DC motor being engaged to turn, obtaining a voltage value of the certain voltage applied to the DC motor to engage the DC motor;

obtaining a corresponding speed value of the DC motor when the DC motor is engaged;

calculating a motor-response value of a property of the DC motor based on the obtained voltage value and the obtained corresponding speed value, wherein the property of the DC motor is one of: a temperature of the DC motor, a torque of the DC motor, or a velocity irregularity of the DC motor;

tracking historical motor-response values of the property of the DC motor by obtaining voltage values applied to the DC motor and corresponding speed values of the DC motor when the DC motor is engaged to turn to move the media for printing, and calculating the historical motor-response values of the property of the DC motor based on the voltage values and the corresponding speed values of the DC motor;

based on the tracked historical motor-response values, determining that at least one tracked motor-response value of the tracked historical motor-response values exceeds a range of defined acceptable operational values; and in response to the determining that the at least one tracked motor-response value exceeds the range of defined acceptable operational values, sending a notification indicating that the DC motor is near its end of life.

2. A method of claim 1, further comprising:
integrating the voltage values applied to the DC motor over time to maintain a model of performance characteristics and thermal behavior of the DC motor.

3. A method of claim 1, wherein the sending of the notification indicating that the DC motor is near its end of life is in response to a combination of multiple tracked motor-response values that exceed the range of defined acceptable operational values.

4. A method of claim 1, further comprising generating a model of the range of defined acceptable operational values, wherein the generating includes:
collecting the historical motor-response values of the property of the DC motor from multiple printing apparatuses; and
based on the collected historical motor-response values, modeling the range of defined acceptable operational values.

5. A method of claim 1, wherein the calculating of the motor-response value of the property of the DC motor includes determining the temperature of the DC motor when the certain voltage was applied to the DC motor based on the obtained voltage value and the obtained corresponding speed value.

6. A method of claim 1, wherein the calculating of the motor-response value of the property of the DC motor includes determining the torque of the DC motor when the certain voltage was applied to the DC motor based on the obtained voltage value and the obtained corresponding speed value.

7. A method of claim 1, wherein the calculating of the motor-response value of the property of the DC motor includes determining the velocity irregularity of the DC motor occurred when the certain voltage was applied to the DC motor based on the obtained voltage value and the obtained corresponding speed value.

8. A system that facilitates prediction of end-of-life of a direct current (DC) motor of a printing apparatus, the system comprising:
a motion control sub-system to control the DC motor of the printing apparatus to turn to move media for printing by applying a certain voltage to the DC motor to engage the DC motor to turn;
a sensor associated with the DC motor to measure the DC motor's speed as a result of the certain voltage applied to the DC motor to engage the DC motor to turn;
a database of historical motor-response values of a property of the DC motor, wherein the property of the DC motor is one of: a temperature of the DC motor, a torque of the DC motor, or a velocity irregularity of the DC motor;
a processor; and
a memory storing instructions that when executed cause the processor to:
obtain voltage values applied to the DC motor and corresponding speed values of the DC motor when the DC motor is engaged to turn to move the media for printing,
calculate the historical motor-response values of the property of the DC motor based on the voltage values and the corresponding speed values of the DC motor,
track the historical motor-response values of the property of the DC motor to determine that at least one of the motor-response values of the property of the DC motor exceeds a range of defined acceptable operational values, and
in response to determining that at least one of the motor-response values of the property of the DC motor exceeds the range of defined acceptable operational values, send a notification indicating that the DC motor is near its end of life.

9. A system of claim 8, wherein, to calculate the historical motor-response values of the property of the DC motor, the instructions cause the processor to:
determine the temperature of the DC motor based on the voltage values and the corresponding speed values of the DC motor.

10. A system of claim 8, wherein, to calculate the historical motor-response values of the property of the DC motor, the instructions cause the processor to:
determine the torque of the DC motor based on the voltage values and the corresponding speed values of the DC motor.

11. A non-transitory computer-readable storage medium storing instructions that, when executed by a processor, cause the processor to perform a prediction of end-of-life of a direct current (DC) motor of a printing apparatus, including instructions that cause the processor to:
in response to the DC motor being engaged to turn to move media for printing, obtain a voltage value of a certain voltage applied to the DC motor to cause the DC motor be engaged to turn;
obtain a corresponding speed value of the DC motor when the DC motor is engaged;
calculate a motor-response value of a property of the DC motor based on the obtained voltage value and the obtained corresponding speed value, wherein the property of the DC motor is one of: a temperature of the DC motor, a torque of the DC motor, or a velocity irregularity of the DC motor;
track historical motor-response values of the DC motor by obtaining voltage values applied to the DC motor and corresponding speed values of the DC motor when the DC motor is engaged to turn to move the media for printing, and calculating the historical motor-response values of the property of the DC motor based on the voltage values and the corresponding speed values of the DC motor;
based on the tracked historical motor-response values, determine that at least one tracked motor-response value of the tracked historical motor-response values exceeds a range of defined acceptable operational values; and
in response to determining that the at least one tracked motor-response value exceeds the range of defined acceptable operational values, sending a notification indicating that the DC motor is near its end of life.

12. A non-transitory computer-readable storage medium of claim 11, wherein, to calculate the historical motor-response values of the property of the DC motor, the instructions cause the processor to:
determine the temperature of the DC motor based on the voltage values and the corresponding speed values of the DC motor.

13. A non-transitory computer-readable storage medium of claim 11, wherein the instructions cause the processor to:
build a database of the tracked historical motor-response values of the DC motor based on data collected from multiple printing apparatuses connected to a communications network.

* * * * *